United States Patent
Tsai et al.

(10) Patent No.: US 10,879,310 B2
(45) Date of Patent: Dec. 29, 2020

(54) MEMORY CIRCUIT AND FORMATION METHOD THEREOF

(71) Applicant: Taiwan Semiconductor Manufacturing Co., Ltd., Hsin-Chu (TW)

(72) Inventors: Chun-Yang Tsai, Hsinchu (TW); Kuo-Ching Huang, Hsinchu (TW); Tong-Chern Ong, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/583,116

(22) Filed: Sep. 25, 2019

(65) Prior Publication Data
US 2020/0020744 A1    Jan. 16, 2020

Related U.S. Application Data

(62) Division of application No. 15/678,557, filed on Aug. 16, 2017, now Pat. No. 10,461,126.

(51) Int. Cl.
*H01L 21/336* (2006.01)
*H01L 29/788* (2006.01)
(Continued)

(52) U.S. Cl.
CPC ...... *H01L 27/2436* (2013.01); *G11C 11/1659* (2013.01); *G11C 11/1673* (2013.01); *G11C 11/1675* (2013.01); *G11C 13/003* (2013.01); *G11C 13/004* (2013.01); *G11C 13/0069* (2013.01); *H01L 45/1253* (2013.01); *G11C 2013/0042* (2013.01);
(Continued)

(58) Field of Classification Search
CPC .................................................. H01L 27/2436
USPC .............. 257/316–322, 326; 438/258, 266
See application file for complete search history.

(56) References Cited

U.S. PATENT DOCUMENTS

| 6,590,244 B2* | 7/2003 | Asao ...................... B82Y 10/00 257/295 |
| 7,205,590 B2* | 4/2007 | Fukuzumi .............. B82Y 10/00 257/208 |

(Continued)

OTHER PUBLICATIONS

Emara, et al. "Differential 1T2M Memristor Memory Cell for Single/Multi-Bit RRAM Modules." 2014 6th Computer Science and Electronics Engineering Conference (CEEC).

(Continued)

*Primary Examiner* — Calvin Lee
(74) *Attorney, Agent, or Firm* — Eschweiler & Potashnik, LLC

(57) ABSTRACT

The present disclosure, in some embodiments, relates to a method of forming an integrated chip. The method may include forming a control device within a substrate. A first plurality of interconnect layers are formed within a first inter-level dielectric (ILD) structure over the substrate. A first memory device and a second memory device are formed over the first ILD structure. A second plurality of interconnect layers are formed within a second ILD structure over the first ILD structure. The first plurality of interconnect layers and the second plurality of interconnect layers couple the first memory device and the second memory device to the control device.

20 Claims, 11 Drawing Sheets

(51) Int. Cl.
*H01L 27/24* (2006.01)
*G11C 11/16* (2006.01)
*G11C 13/00* (2006.01)
*H01L 45/00* (2006.01)

(52) U.S. Cl.
CPC ............ *G11C 2013/0071* (2013.01); *G11C 2013/0073* (2013.01); *G11C 2013/0088* (2013.01); *G11C 2213/71* (2013.01); *G11C 2213/78* (2013.01); *G11C 2213/79* (2013.01); *G11C 2213/82* (2013.01)

(56) References Cited

U.S. PATENT DOCUMENTS

| | | | |
|---|---|---|---|
| 7,236,393 B2 | 6/2007 | Cho et al. | |
| 7,483,291 B2 * | 1/2009 | Saito | B82Y 10/00 365/158 |
| 8,432,722 B2 | 4/2013 | Maejima et al. | |
| 8,681,537 B2 * | 3/2014 | Lee | G11C 5/063 365/148 |
| 8,885,396 B2 * | 11/2014 | Yamanaka | H01L 43/08 365/148 |
| 9,053,788 B2 * | 6/2015 | Azuma | G11C 13/0064 |
| 9,312,019 B1 | 4/2016 | Sakamoto | |
| 9,576,653 B1 | 2/2017 | Chou | |
| 10,026,481 B2 | 7/2018 | Sonoda et al. | |
| 10,047,658 B2 | 8/2018 | Yoshikawa et al. | |
| 2005/0180194 A1 | 8/2005 | Kang | |
| 2009/0014836 A1 | 1/2009 | Lee et al. | |
| 2012/0257445 A1 | 10/2012 | Lee | |
| 2014/0219002 A1 | 8/2014 | Lee et al. | |
| 2017/0011796 A1 | 1/2017 | Park | |

OTHER PUBLICATIONS

Notice of Allowance dated Jun. 24, 2019 for U.S. Appl. No. 15/678,557.

* cited by examiner

700 ↘

| Operation | Set T & Reset C | Reset T & Set C | Read |
|---|---|---|---|
| WL | $V_{WL} > 0$ (e.g., 1.1~2.0V) | $V_{WL} > 0$ (e.g., 2.2~2.8V) | $V_{WL} > 0$ (e.g., 1.1V) |
| BL | $V_{BL} > 0$ (e.g., 1.5~2.0V) | 0 | $B_{LT}$ & $B_{LC} > 0$ (e.g., 0.3V) |
| SL | 0 | $V_{SL} > 0$ (e.g., 1.5~2.0V) | 0 |

- Apply a non-zero word-line voltage to a gate of an access transistor having a first source/drain terminal coupled to a lower electrode of a target device and an upper electrode of a complementary device — 802
- Concurrently apply a non-zero bit-line voltage to an upper electrode of the target device and a lower electrode of the complementary device — 804
- Apply a substantially zero source-line voltage a second source/drain terminal of the access transistor — 806

Fig. 8A

MEMORY CIRCUIT AND FORMATION METHOD THEREOF

REFERENCE TO RELATED APPLICATION

This Application is a Continuation of U.S. application Ser. No. 15/678,557, filed on Aug. 16, 2017, now U.S. Pat. No. 10,461,126 issued Oct. 29, 2019, the contents of which are hereby incorporated by reference in their entirety.

BACKGROUND

Many modern day electronic devices contain electronic memory configured to store data. Electronic memory may be volatile memory or non-volatile memory. Volatile memory stores data when it is powered, while non-volatile memory (NVM) is able to store data when power is removed. Unlike conventional NVM devices (e.g., flash, EEPROM, etc.), many promising candidates for a next generation NVM technology use memory cells that are located within a back-end-of-the-line (BEOL) of an integrated chip (e.g., located between metal interconnect layers overlying a semiconductor substrate).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 illustrates a table showing some embodiments of operating conditions of a RRAM circuit having a shared transistor for access to target and complementary RRAM devices.

FIGS. 8A-8C illustrate flow diagrams of some embodiments of methods of operating a RRAM circuit having a shared transistor for access to target and complementary RRAM devices.

DETAILED DESCRIPTION

Figure 1:
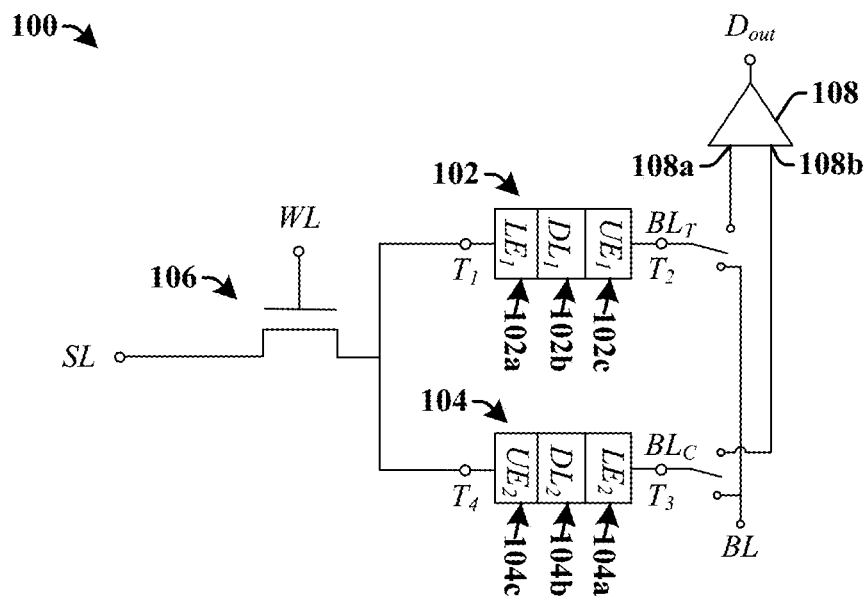
FIG. 1 illustrates a schematic diagram of some embodiments of a memory circuit having a shared control device configured to provide access to target and complementary memory devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In many modern day memory circuits, differential sensing is used to read data from a memory circuit. Differential sensing allows for a small signal to generate a strong output state. Differential sensing uses two data lines for each bit read from a memory cell. The first data line transits a first signal (e.g., a low signal) and the second data line transits a complementary second signal (e.g., a high signal). A difference between the first and second signals is determined by a sensing amplifier and a data state of "1" or "0" is determined from the difference. Differential sensing offers a number of advantages over single line sensing (e.g., sensing against a reference voltage), such as more accurate reading due to a greater tolerance to noise.

However, memory cells that use differential sensing generally have a larger cell size since the memory cells use both a target device and a complementary device to store a data state. The larger cell size causes memory arrays to consume a larger silicon area, thereby increasing an overall cost of an integrated chip. Furthermore, during operation of a memory array that uses differential sensing, data has to be written to both a target device and a complementary device to store a data bit, thereby driving a larger write time than single ended sensing schemes.

The present disclosure relates to a memory circuit having a shared control device for access to both target and complementary memory devices of a memory array configured to operate using differential sensing, and an associated method of formation. In some embodiments, the memory circuit has a control device arranged within a substrate. The control device has a first terminal coupled to a source-line, a second terminal coupled to a word-line, and a third terminal. A first memory device is arranged over the substrate and has a first lower electrode separated from a first upper electrode by a first data storage layer. The first upper electrode is coupled to the third terminal and the first lower electrode is coupled to a first bit-line. A second memory device is arranged over the substrate and has a second lower electrode separated from a second upper electrode by a second data storage layer. The second upper electrode is coupled to the second bit-line and the second lower electrode is coupled to the third terminal. By connecting the upper electrode of the first memory device and the lower electrode of the second memory device to a same control device, data can be concurrently written to both the first (e.g., target) and second (e.g., complementary) memory devices using a memory cell with a relatively small footprint.

FIG. 1 illustrates a schematic diagram of some embodiments of a memory circuit 100 having a shared control device configured to provide access to both target and complementary memory devices.

The memory circuit 100 comprises a target memory device 102 and a complementary memory device 104 coupled between a shared source-line SL and parallel bit-lines, $BL_T$ and $BL_C$. The target memory device 102 has a first lower electrode 102a coupled to a first terminal $T_1$ and a first upper electrode 102c coupled to a second terminal $T_2$. The first lower electrode 102a is separated from the first upper electrode 102c by way of a first data storage layer 102b. The complementary memory device 104 has a second lower electrode 104a coupled to a third terminal $T_3$ and a second upper electrode 104c coupled to a fourth terminal $T_4$. The second lower electrode 104a is separated from the second upper electrode 104c by way of a second data storage layer 104b.

The target memory device 102 and the complementary memory device 104 are coupled to the shared source-line SL and to the bit-lines, $BL_T$ and $BL_C$, in configurations that are inverted with respect to one another. For example, the first terminal $T_1$ and the fourth terminal $T_4$ are coupled to the shared source-line SL by way of a shared control device 106, so that the first lower electrode 102a and the second upper electrode 104c are coupled to the shared source-line SL. The second terminal $T_2$ and the third terminal $T_3$ are respectively coupled to the bit-lines, $BL_T$ and $BL_C$, so that the first upper electrode 102c and the second lower electrode 104a may be selectively coupled to a first input 108a and a second input 108b of a sense amplifier 108 concurrently.

Coupling the target memory device 102 and the complementary memory device 104 to the shared source-line SL and the bit-lines, $BL_T$ and $BL_C$, in inverted configurations will result in bias voltages of opposite polarities across the target memory device 102 and the complementary memory device 104. For example, during a write operation, the inverted configuration allows for a first potential difference to be applied between the first lower electrode 102a and the first upper electrode 102c of the target memory device 102 and a second potential difference having an opposite sign as the first potential difference to be applied between the second lower electrode 104a and the second upper electrode 104c of the complementary memory device 104. The opposite potential differences allow for different data states to be concurrently written in parallel to the target memory device 102 and the complementary memory device 104 using the shared control device 106, thereby providing the memory circuit 100 with a small size and fast write time.

Figure 2:
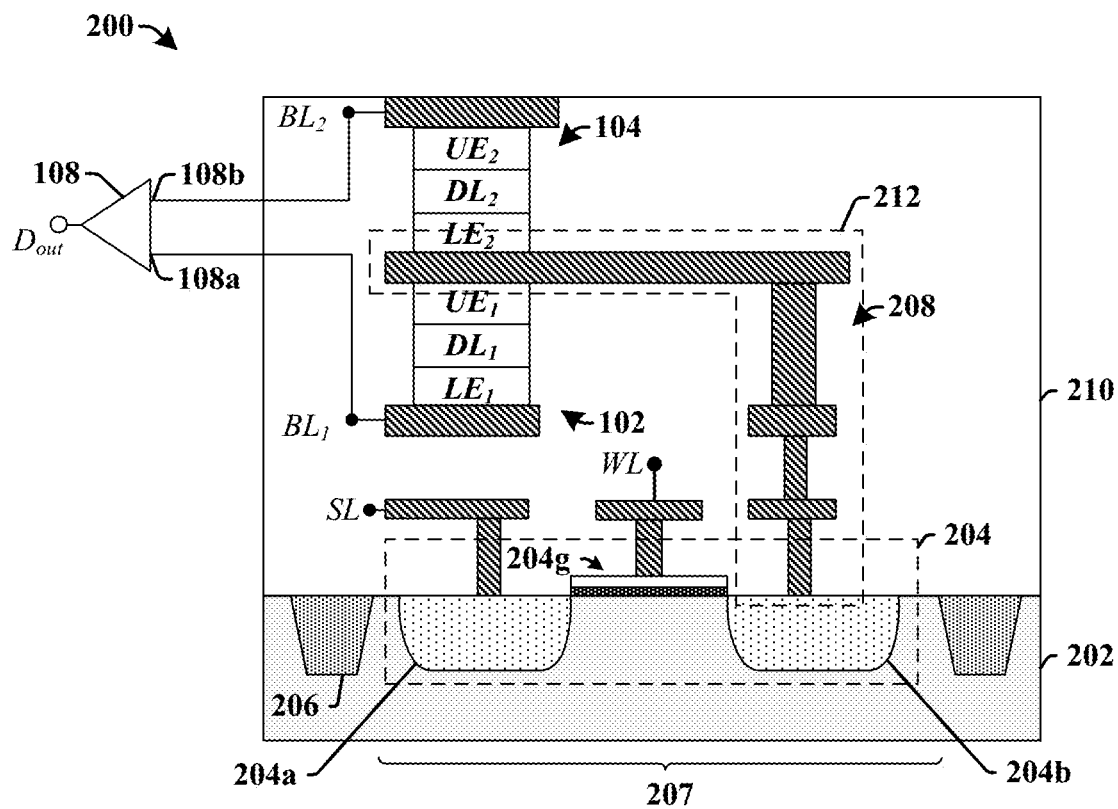
FIG. 2 illustrates a cross-sectional view of some embodiments of a memory circuit having a shared control device configured to provide access to target and complementary memory devices.

FIG. 2 illustrates a cross-sectional view of some embodiments of a memory circuit 200 having a shared control device configured to provide access to both target and complementary memory devices.

The memory circuit 200 comprises a shared control device 204 arranged within a substrate 202. In various embodiments, the shared control device 204 may comprise a MOSFET, a bi-polar junction transistor (BJT), a high electron mobility transistor (HEMT), or a similar device. The shared control device 204 has a first terminal coupled to a source-line SL, a second terminal coupled to a word-line WL, and a third terminal. In some embodiments, wherein the shared control device 204 comprises a MOSFET, the first terminal may comprise a first source/drain region 204a, the second terminal may comprise a gate structure 204g, and the third terminal may comprise a second source/drain region 204b. In some embodiments, the shared control device 204 may be arranged within a memory cell region 207 disposed between isolation regions 206 (e.g., shallow trench isolation regions) within the substrate 202.

A dielectric structure 210 is arranged over the substrate 202. A plurality of conductive interconnect layers 208 are surrounded by the dielectric structure 210. The plurality of conductive interconnect layers 208 couple the third terminal of the shared control device 204 to a target memory device 102 and to a complementary memory device 104 within the dielectric structure 210. In some embodiments, the target memory device 102 and the complementary memory device 104 are arranged directly above the memory cell region 207, thereby providing the memory cell with a small footprint. In various embodiments, the target memory device 102 and the complementary memory device 104 may comprise RRAM (resistive random access memory) devices, PCRAM (phase change random access memory) devices, FRAM (ferroelectric random access memory) devices, MRAM (magneto-resistive random access memory) devices, CBRAM (conductive bridging random access memory) devices, or carbon nano-tube (CNT) memory devices, or the like.

The target memory device 102 comprises a first upper electrode $UE_1$ coupled to the third terminal by way of a first conductive path comprising the plurality of conductive interconnect layers 208, a first lower electrode $LE_1$ coupled to a first bit-line $BL_1$, and a first data storage layer $DL_1$ arranged between the first upper electrode $UE_1$ and the first lower electrode $LE_1$. The first bit-line $BL_1$ is configured to be selectively coupled to a first input 108a of a sense amplifier 108. The complementary memory device 104 comprises a second lower electrode $LE_2$ coupled to the third terminal by way of a second conductive path comprising the plurality of conductive interconnect layers, a second upper electrode $UE_1$ coupled to a second bit-line $BL_2$, and a second data storage layer $DL_2$ arranged between the second upper electrode $UE_2$ and the second lower electrode $LE_2$. The second bit-line $BL_2$ is configured to be selectively coupled to a second input 108b of the sense amplifier 108.

In some embodiments, the first conductive path and the second conductive path may comprise a same path 212. In other embodiments, the first conductive path may be a subset of the second conductive path. The first and second conductive paths may comprise a conductive wire (extending parallel to an upper surface of the substrate 202) and a conductive via (extending perpendicular to the upper surface of the substrate 202).

FIGS. 3A-3D illustrate some embodiments of schematic diagrams showing operation of a disclosed memory circuit.

Figure 3B:
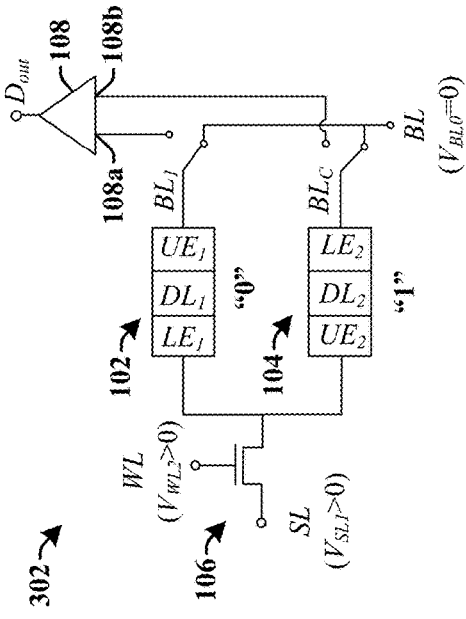
FIGS. 3A-3D illustrate some embodiments of schematic diagrams showing operation of a disclosed memory circuit.
Figure 3D:
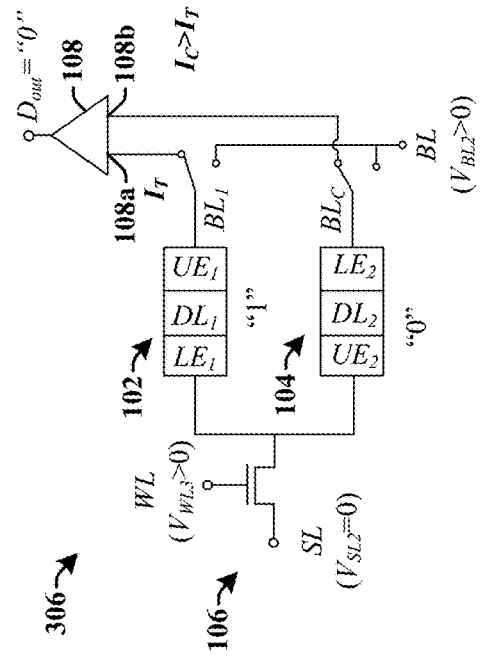
Figure 3A:
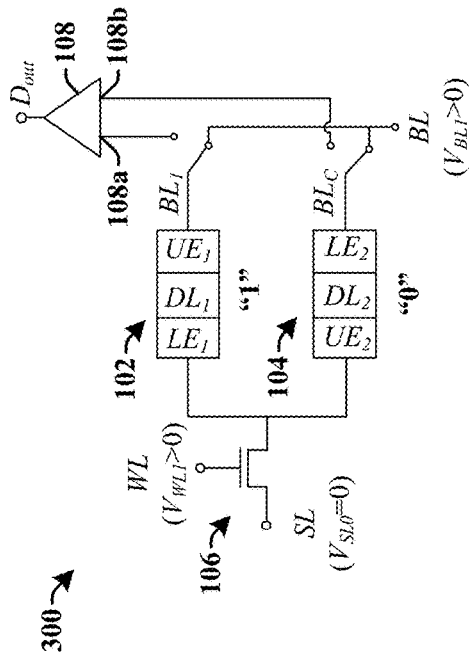

FIG. 3A illustrates a schematic diagram 300 of an example of a first write operation to write a high data state to a target memory device 102 and a low data state to a complementary memory device 104.

The first write operation is performed by applying a first non-zero word-line voltage $V_{WL1}$ to the word-line WL, a first non-zero bit-line voltage $V_{BL1}$ to the bit-line BL, and a substantially zero source-line voltage $V_{SL0}$ to the source-line SL. The first non-zero word-line voltage $V_{WL1}$ turns on the control device 106 to form a conductive path between the source-line SL and the target memory device 102 and between the source-line SL and the complementary memory device 104.

The first non-zero bit-line voltage $V_{BL1}$ and the substantially zero source-line voltage $V_{SL0}$ form a first potential difference between a lower electrode $LE_1$ and an upper electrode $UE_1$ of the target memory device 102. The first potential difference causes a high data state (e.g., a '1') to be written to the target memory device 102. The first non-zero bit-line voltage $V_{BL1}$ and the substantially zero source-line voltage $V_{SL0}$ also form a second potential difference between a lower electrode $LE_2$ and an upper electrode $UE_2$ of the complementary memory device 104, which has an opposite sign as the first potential difference. The second potential difference causes a low data state (e.g., a '0') to be written to the complementary memory device 104.

FIG. 3B illustrates a schematic diagram 302 of an example of a second write operation to write a low data state to a target memory device 102 and a high data state to a complementary memory device 104.

The second write operation is performed by applying a second non-zero word-line voltage $V_{WL2}$ to the word-line WL, a substantially zero bit-line voltage $V_{BL0}$ to the bit-line BL, and a first non-zero source-line voltage $V_{SL1}$ to the source-line SL. The second non-zero word-line voltage $V_{WL2}$ turns on the control device 106 to form a conductive path between the source-line SL and the target memory device 102 and between the source-line SL and the complementary memory device 104.

The substantially zero bit-line voltage $V_{BL0}$ and the first non-zero source-line voltage $V_{SL1}$ form a first potential different between the lower electrode $LE_1$ and the upper electrode $UE_1$ of the target memory device 102. The first potential difference writes a low data state (e.g., a '0') to the target memory device 102. The substantially zero bit-line voltage $V_{BL0}$ and the first non-zero source-line $V_{SL1}$ voltage also form a second potential different between the lower electrode $LE_2$ and the upper electrode $UE_2$ of the complementary memory device 104, which has an opposite sign as the first potential difference. The second potential difference causes a high data state (e.g., a '1') to be written to the complementary memory device 104.

Figure 3C:
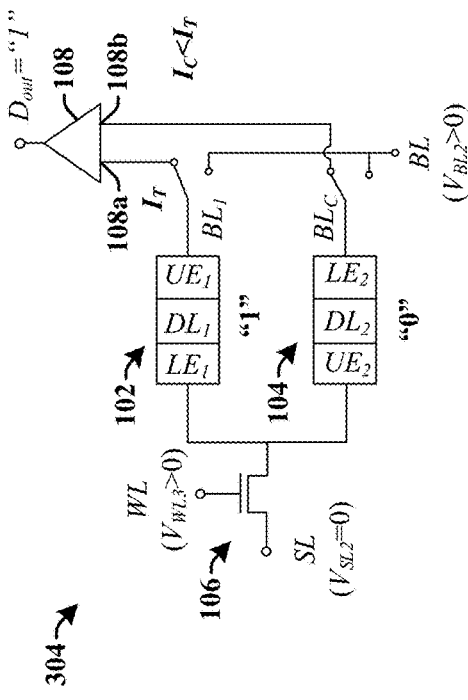

FIGS. 3C-3D illustrate schematic diagrams, 304 and 306, of exemplary read operations to read a data state from a target memory device. It will be appreciated that in the read operations shown in FIGS. 3C-3D, the described bias conditions allow for data to be read from the target memory device 102 along the bit-lines. However, in some alternative embodiments, data may be read from the target memory device along the source-lines. In such embodiments, a non-zero bias voltage is applied to the source-line SL.

In some embodiments, a read operation may be performed by applying a third non-zero word-line voltage $V_{WL3}$ to the word-line WL and a second non-zero bit-line voltage $V_{BL2}$ to the bit-line BL. The second non-zero word-line voltage $V_{WL2}$ turns on the control device 106 to form a conductive path between the source-line SL and the target memory device 102 and between the source-line SL and the complementary memory device 104.

As shown in schematic diagram 304 of FIG. 3C, if the target memory device 102 is storing a high data state, the charges stored in the target memory device 102 will cause a first current $I_T$ to be provided to a first input 108a of a sense amplifier 108 by way of a target bit-line $BL_T$, and a second current $I_C < I_T$ to be provided to a second input 108b of the sense amplifier 108 by way of a complementary bit-line $BL_C$. The sense amplifier 108 is configured to compare the first current $I_T$ to the second current $I_C$ and based upon the comparison to output a signal corresponding to a high data state (e.g., a '1').

As shown in schematic diagram 306 of FIG. 3D, if the target memory device 102 is storing a low data state, the charges stored in the target memory device 102 will cause a first current $I_T$ to be provided to the first input 108a of the sense amplifier 108 by way of the target bit-line $BL_T$, and a second current $I_C > I_T$ to be provided to the second input 108b of the sense amplifier 108 by way of the complementary bit-line $BL_C$. The sense amplifier 108 is configured to compare the first current $I_T$ to the second current $I_C$ and based upon the comparison to output a signal corresponding to a low data state (e.g., a '0').

Figure 4:
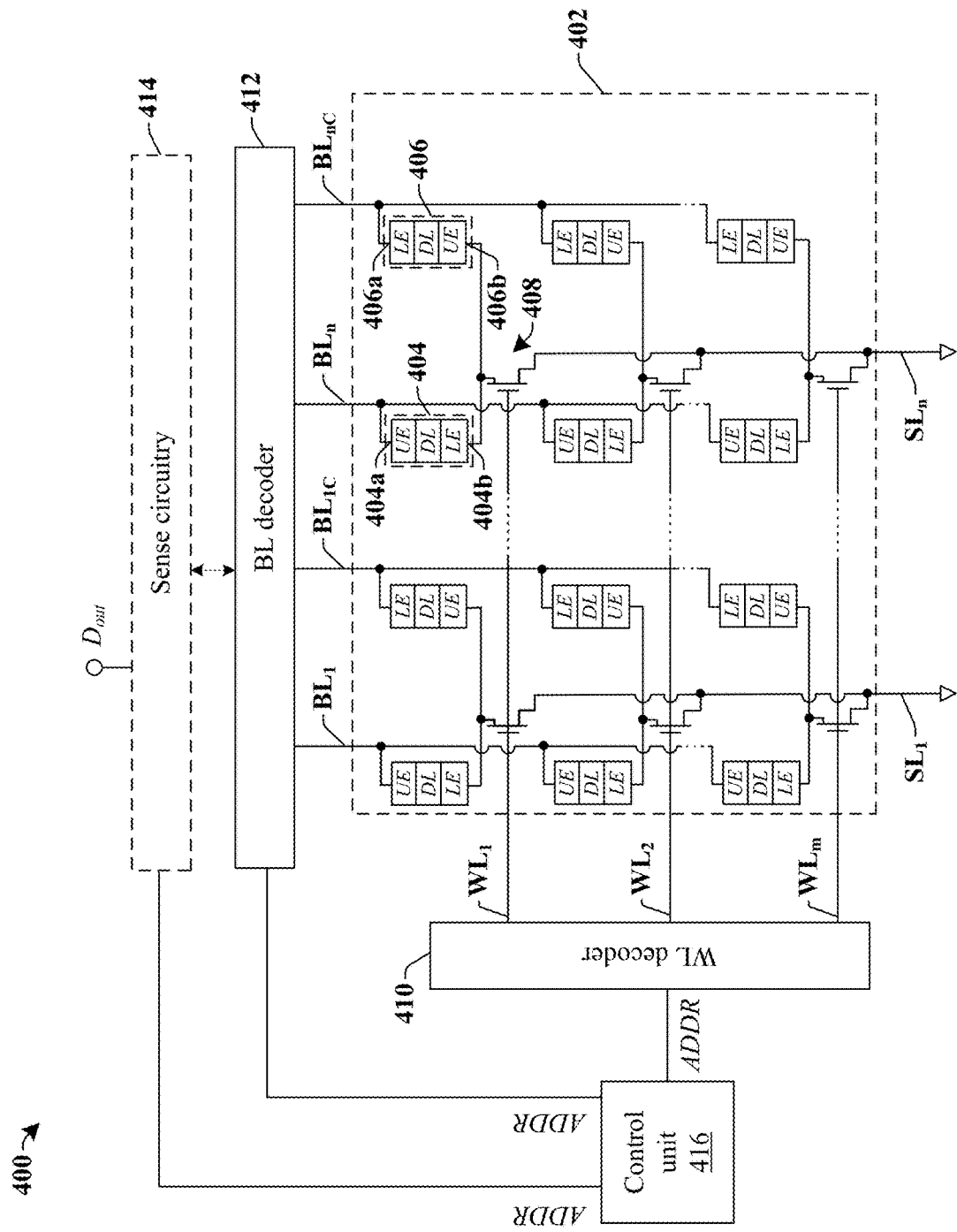
FIG. 4 illustrates a schematic diagram of some embodiments of a memory array having shared transistors for access to target and complementary memory devices.

FIG. 4 illustrates a schematic diagram of some embodiments of a memory circuit 400 having shared transistors configured to provide access to target and complementary memory devices.

The memory circuit 400 comprises a memory array 402 having a plurality of target memory devices 404 (e.g., corresponding to target memory devices 102) and a plurality of complementary memory devices 406 (e.g., corresponding to complementary memory devices 104). The target memory devices 404 and the complementary memory devices 406 are arranged within the memory array 402 in rows and/or columns. Target memory devices 404 and complementary memory devices 406 within a row are operably coupled to a word-line $WL_1$-$WL_m$. Target memory devices 404 within a column are operably coupled to a bit-line $BL_1$-$BL_n$ and a source-line $SL_1$-$SL_n$, while complementary memory devices 406 within a column are operably coupled to a complementary bit-line $BL_{1C}$-$BL_{nC}$ and a source-line $SL_1$-$SL_n$.

Access transistors 408 are coupled to the target memory devices 404 and to the complementary memory devices 406. In some embodiments, the target memory devices 404 have a first terminal 404a coupling an upper electrode to a bit-line $BL_1$-$BL_n$ and a second terminal 404b coupling a lower electrode to a first terminal of the access transistor 408. The complementary memory devices 406 also have a first terminal 406a coupling a lower electrode to a complementary bit-line $BL_{1C}$-$BL_{nC}$ and a second terminal coupling an upper electrode to the first terminal of the access transistor 408. The access transistor 408 further has a gate coupled to a word-line $WL_1$-$WL_m$ and a source coupled to a source-line $SL_1$-$SL_n$.

The memory array 402 is coupled to support circuitry that is configured to read data from and/or write data to the target memory devices 404 and to the complementary memory devices 406. In some embodiments, the support circuitry comprises a word-line decoder 410, a bit-line decoder 412, sensing circuitry 414 comprising one or more sense amplifiers, and a control unit 416. The word-line decoder 410 is configured to selectively apply a signal (e.g., a current and/or voltage) to one of the word-lines $WL_1$-$WL_2$, and the bit-line decoder 412 is configured to selectively apply a signal to one of the plurality of bit-lines $BL_1$-$BL_2$ based upon an address ADDR received from the control unit 416. By selectively applying signals to the word-lines $WL_1$-$WL_2$, the bit-lines $BL_1$-$BL_2$, the support circuitry is able to perform forming, set, reset, and read operations on selected ones of the target memory devices 404 and/or the complementary memory devices 406, as described above.

Figure 5:
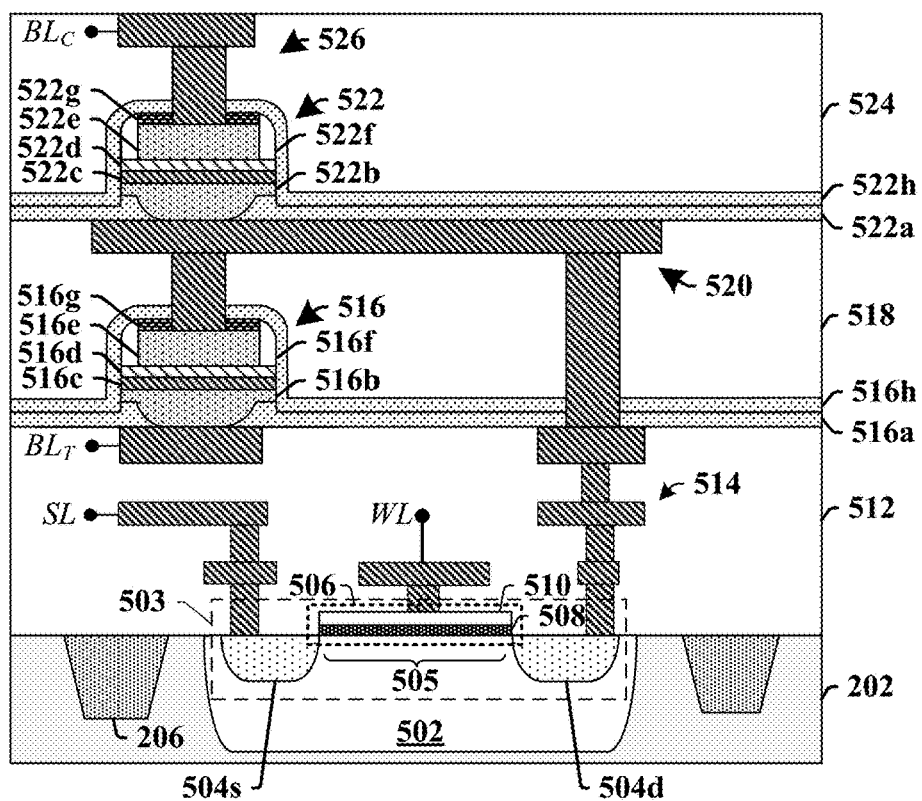
FIG. 5 illustrates a cross-sectional view of some embodiments of an integrated chip having a shared transistor for access to target and complementary RRAM devices.
Figure 6:
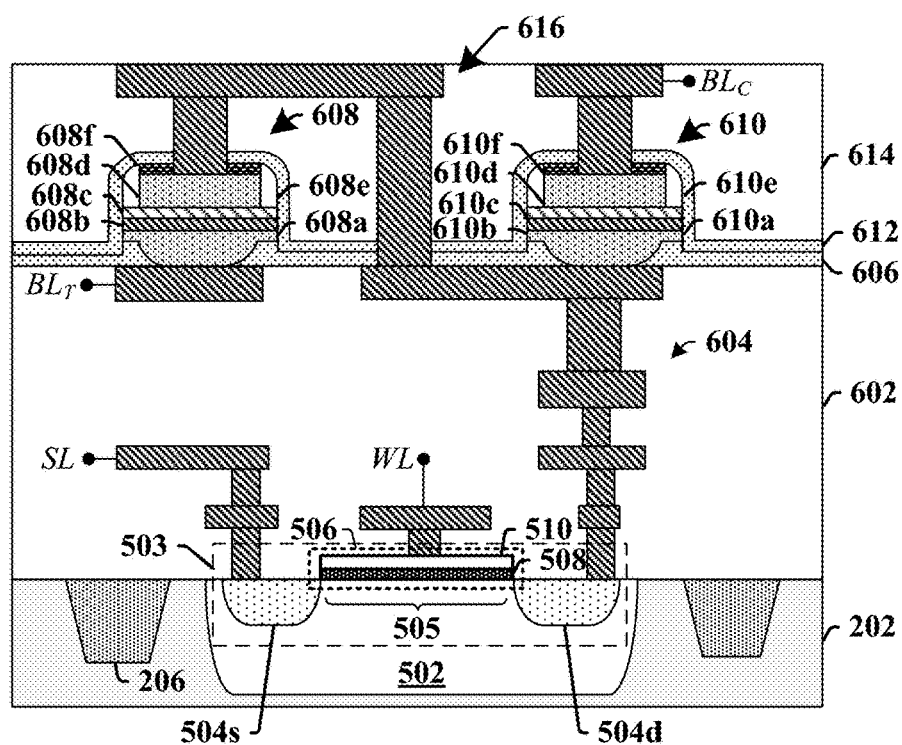
FIG. 6 illustrates a cross-sectional view of some alternative embodiments of an integrated chip having a shared transistor for access to target and complementary RRAM devices.

FIGS. 5-6 illustrate cross-sectional views of some embodiments of memory circuits having a target RRAM device (e.g., corresponding to 102) and a complementary RRAM device (e.g., corresponding to 104) coupled to a shared access transistor (e.g., corresponding to 204). It will be appreciated that the RRAM circuits, 500 and 600, shown in FIGS. 5-6 are non-limiting examples of RRAM circuits that have a shared access transistor, and that in other embodiments RRAM circuits may have different architectures while still having a shared access transistor.

FIG. 5 illustrates a cross-sectional view of some embodiments of an RRAM circuit 500 having a shared transistor for access to target and complementary RRAM devices.

The RRAM circuit 500 comprises an access transistor 503 disposed within a substrate 202. In some embodiments, the access transistor 503 may be arranged within a well region 502. The access transistor 503 comprises a source region 504s, a drain region 504d separated from the source region 504s by a channel region 505, and a gate structure 506 arranged over the channel region 505. The gate structure 506 comprises a gate electrode 510 separated from the channel region 505 by a gate dielectric layer 508.

A first inter-level dielectric (ILD) structure 512 is arranged over the substrate 202. In some embodiments, the first ILD structure 512 may comprise one or more stacked dielectric layers (e.g., an oxide layer, a low-k dielectric layer, and/or an ultra low-k dielectric layer). The one or more stacked dielectric layers may be separated from one another by an etch stop layer (not shown). A first plurality of interconnect layers 514 (e.g., contact, wire, and via layers) are surrounded by the first ILD structure 512. In some embodiments, the first plurality of interconnect layers 514 may comprise copper, tungsten, and/or aluminum. The first plurality of interconnect layers 514 are configured to couple the source region 504s to a source-line SL and the gate electrode 510 to a word-line WL. In some embodiments, the source-line SL may be arranged on a second metal wire layer and the word-line WL may be arranged on the first metal wire layer.

A target RRAM device 516 is arranged within a second ILD structure 518 over the first ILD structure 512. The target RRAM device 516 comprises a lower electrode 516b, a data storage structure 516c having a variable resistance, and an upper electrode 516e. In some embodiments, the target RRAM device 516 may further comprise a lower insulating layer 516a surrounding a bottom part of the lower electrode 516b, a capping layer 516d between the data storage structure 516c and the upper electrode 516e, sidewall spacers 516f on opposing sides of the upper electrode 516e, a masking layer 516g over the upper electrode 516e, and/or an upper insulating layer 516h over the masking layer 516g. The lower electrode 516b is coupled to a target bit-line $BL_T$ by one or more of the first plurality of interconnect layers 514. In some embodiments, the target bit-line $BL_T$ may be arranged on a third metal wire layer. A second ILD structure 518 is disposed over target RRAM device 516, and a second plurality of interconnect layers 520 are arranged within the second ILD structure 518. The second plurality of interconnect layers 520 are configured to couple the upper electrode 516e of the target RRAM device 516 to the drain region 504d by way of the first plurality of interconnect layers 514.

In some embodiments, the lower electrode 516b and the upper electrode 516e may comprise a metal, such as tantalum (Ta) and/or titanium (Ti). In some embodiments, the data storage structure 516c may comprise a high-k dielectric material, such as titanium aluminum oxide, hafnium tantalum oxide, zirconium lanthanum oxide, or other suitable materials. In some embodiments, the capping layer 516d may comprise a metal (e.g., such as titanium (Ti), hafnium (Hf), platinum (Pt), aluminum (Al)) or a metal oxide (e.g., such as titanium oxide (TiO), hafnium oxide (HfO), zirconium oxide (ZrO), germanium oxide (GeO), cesium oxide (CeO)), or other suitable materials. In some embodiments, the masking layer 516g may comprise a silicon oxy-nitride (SiON) hard mask layer, a silicon dioxide ($SiO_2$) hard mask layer, a PE-SiN hard mask, or other suitable materials.

A complementary RRAM device 522 is arranged within a third ILD structure 524 over the second ILD structure 518. The complementary RRAM device 522 comprises a lower electrode 522b, a data storage structure 522c arranged over the lower electrode 522b, and an upper electrode 522e arranged over the data storage structure 522c. In some embodiments, the complementary RRAM device 522 may also comprise a lower insulating layer 522a surrounding a bottom part of the lower electrode 522b, a capping layer 522d arranged between the data storage structure 522c and the upper electrode 522e, sidewall spacers 522f disposed on opposing sides of the upper electrode 522e, a masking layer 522g disposed over the upper electrode 522e, and/or an upper insulating layer 522h may be arranged over the masking layer 522g.

The second plurality of interconnect layers 520 are configured to couple the lower electrode 522b of the complementary RRAM device 522 to the drain region 504d by way of the first plurality of interconnect layers 514. In some embodiments, the second plurality of interconnect layers 520 may comprise a metal wire that extends between the upper electrode 516e and the lower electrode 522b. A third ILD structure 524 is arranged over the complementary RRAM device 522. The third ILD structure 524 surrounds a third plurality of interconnect layers 526 configured to couple the upper electrode 522e of a complementary bit-line $BL_C$. In some embodiments, the third ILD structure 524 may comprise an ILD layer (e.g., having a single dielectric material) separated from the second ILD structure 518 by an etch stop layer. In some embodiments, the complementary bit-line $BL_C$ may be arranged on a fifth metal wire layer.

The target RRAM device 516 and the complementary RRAM device 522 are arranged at different heights with respect to the substrate 202. For example, the target RRAM device 516 has a bottommost surface that is closer to the substrate 202 than a bottommost surface of the complementary RRAM device 522. In some embodiments, the complementary RRAM device 522 may be arranged directly above the target RRAM device 516. In some embodiments, the complementary RRAM device 522 may be arranged directly above the access transistor 503. In some embodiments, the complementary RRAM device 522 and the target RRAM device 516 may be laterally offset from one another, but arranged above a memory cell region between isolation regions 206 within the substrate 202. Having the target RRAM device 516 and the complementary RRAM device 522 on different vertical positions allows for the memory cell to achieve a small footprint.

FIG. 6 illustrates a cross-sectional view of some alternative embodiments of a RRAM circuit 600 having a shared transistor for access to target and complementary RRAM cells.

The RRAM circuit 600 comprises an access transistor 503 arranged within a substrate 202 and having a source region 504s, a drain region 504d, and a gate structure 506. A first ILD structure 602 is arranged over the substrate 202. In some embodiments, a first plurality of interconnect layers 604 are surrounded by the first ILD structure 602. The first plurality of interconnect layers 604 are configured to couple the source region 504s to a source-line SL and the gate electrode 510 to a word-line WL.

A second ILD structure 614 is over the first ILD structure 602 and surrounds a target RRAM device 608, a complementary RRAM device 610, and a second plurality of interconnect layers 616. A horizontal plane extending parallel to a top surface of the substrate 202 extends through the target RRAM device 608 and the complementary RRAM device 610. In some embodiments, the second ILD structure 614 may comprise an ILD layer (e.g., having a single dielectric material) separated from the first ILD structure 602 by an etch stop layer.

The target RRAM device 608 comprises a lower electrode 608a, a data storage structure 608b having a variable resistance, and an upper electrode 608d arranged over the data storage structure 608b. In some embodiments, the target RRAM device 608 may further comprise a capping layer 608c arranged between the data storage structure 608b and the upper electrode 608d, sidewall spacers 608e disposed on opposing sides of the upper electrode 608d, and/or a masking layer 608f disposed over the upper electrode 608d. The lower electrode 608a is coupled to a target bit-line $BL_T$ by way of the first plurality of interconnect layers 604. The upper electrode 608d is coupled to the drain region 504d by way of the first plurality of interconnect layers 604 and the second plurality of interconnect layers 616.

The complementary RRAM device 610 comprises a lower electrode 610a, a data storage structure 610b arranged over the lower electrode 610a, and an upper electrode 610d arranged over the data storage structure 610b. In some embodiments, the complementary RRAM device 610 comprises may further comprise a capping layer 610c arranged between the data storage structure 610b and the upper electrode 610d, sidewall spacers 610e disposed on opposing sides of the upper electrode 610d, and/or a masking layer 610f disposed over the upper electrode 610d. In some embodiments, the target RRAM device 608 and the complementary RRAM device 610 are arranged over a lower insulating layer 606 and are covered by an upper insulating layer 612. The lower electrode 608a is coupled to the drain region 504d by way of the first plurality of interconnect layers 604. The upper electrode 608d is coupled to a complementary bit-line $BL_C$ by way of the second plurality of interconnect layers 616.

It will be appreciated that although RRAM circuits 500 and 600 are described as having complementary and target RRAM devices at certain locations, that in other embodiments the locations of the complementary and target RRAM devices may be switched. For example, in some embodiments, a target RRAM device may be above a complementary RRAM device.

FIG. 7 illustrates a table 700 showing some embodiments of operating conditions of an RRAM circuit having a shared transistor for access to target and complementary RRAM devices. The table 700 comprises a first column 702 describing exemplary bias conditions to set a target RRAM device to a high data state (e.g., corresponding to a logical '1') and to reset a complementary RRAM device to a low data state (e.g., corresponding to a logical '0'), a second column 704 describing exemplary bias conditions to reset a target RRAM device to a low data state and to set a complementary RRAM device to a high data state, and a third column 706 describing exemplary bias conditions to read data from a target RRAM device.

Figure 8B:
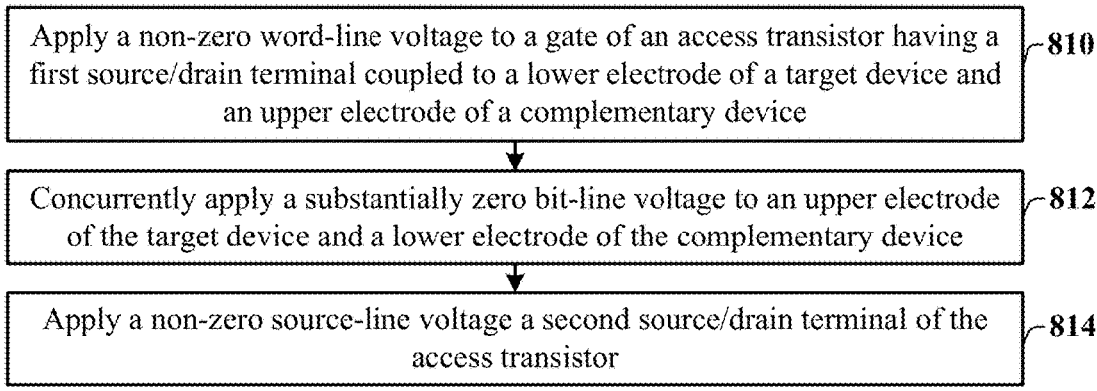
Figure 8C:
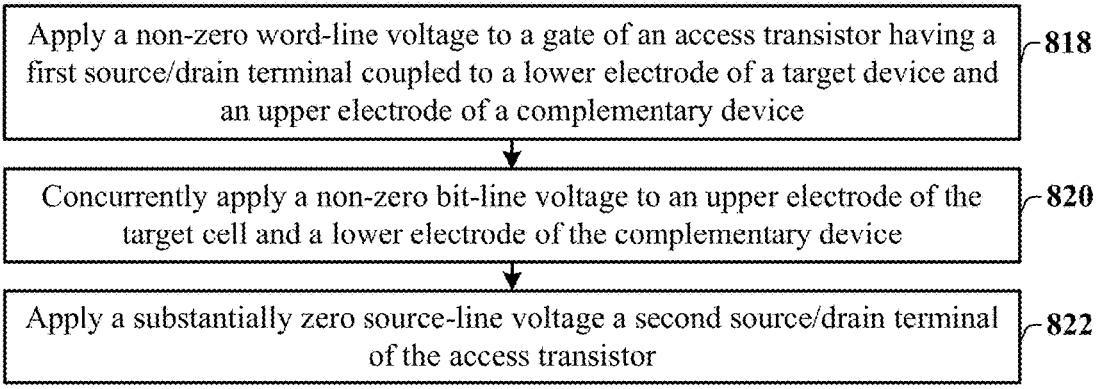

FIGS. 8A-8C illustrate flow diagrams of some embodiments of methods of operating an RRAM circuit having a shared transistor for access to target and complementary memory devices. It will be appreciated that in some non-limiting embodiments, the methods of operating an RRAM circuit may be applied to the RRAM circuits, 500 and/or 600, of FIGS. 5-6.

FIG. 8A illustrates a flow diagram of some embodiments of a method 800 of writing a high data state to a RRAM memory cell within a memory circuit having a shared control device configured to provide access to target and complementary memory devices. Column 702 of table 700 illustrates some examples of bias conditions corresponding to acts 802-806 of method 800.

At 802, a non-zero word-line voltage is applied to a gate of an access transistor having a first source/drain terminal coupled to a lower electrode of a target device and an upper electrode of a complementary device.

At 804, a non-zero bit-line voltage is concurrently applied to an upper electrode of the target device and a lower electrode of the complementary device.

At 806, a substantially zero source-line voltage is applied to a second source/drain terminal of the access transistor. The substantially zero source-line voltage causes the lower electrode of the target device to be held at a low voltage potential, which drives the target device to a high data state. The substantially zero source-line voltage also causes the upper electrode of the complementary device to be held at a low voltage potential, which drives the complementary device to a low data state.

FIG. 8B illustrates a flow diagram of some embodiments of a method 808 of writing a low data state to a target memory device of a memory circuit having a shared control device for access to target and complementary memory devices. Column 704 of table 700 illustrates some examples of bias conditions corresponding to acts 810-814 of method 808.

At 810, a non-zero word-line voltage is applied to a gate of an access transistor having a first source/drain terminal coupled to a lower electrode of a target device and an upper electrode of a complementary device.

At 812, a substantially zero bit-line voltage is concurrently applied to an upper electrode of the target device and a lower electrode of the complementary device.

At 814, a non-zero source-line voltage is applied to a second source/drain terminal of the access transistor. The non-zero source-line voltage causes the lower electrode of the target device to be held at a high voltage potential, which drives the target device to a low data state. The non-zero source-line voltage also causes the upper electrode of the complementary device to be held at a high voltage potential, which drives the complementary device to a high data state.

FIG. 8C illustrates a flow diagram of some embodiments of a method 816 of reading a data state from a target memory device of a memory circuit having a shared control device for access to target and complementary memory devices. Column 706 of table 700 illustrates some examples of bias conditions corresponding to acts 818-822 of method 816.

At 818, a non-zero word-line voltage is applied to a gate of an access transistor having a first source/drain terminal coupled to a lower electrode of a target device and an upper electrode of a complementary device.

At 820, a non-zero bit-line voltage is concurrently applied to an upper electrode of the target device and a lower electrode of the complementary device.

At 822, a substantially zero source-line voltage is applied to a second source/drain terminal of the access transistor.

FIGS. 9-13 illustrate cross-sectional views 900-1300 of some embodiments of a method of forming an integrated chip comprising a memory circuit having a shared transistor for access to both target and complementary devices. Although FIGS. 9-13 are described in relation to a method, it will be appreciated that the structures disclosed in FIGS. 9-13 are not limited to such a method, but instead may stand alone as structures independent of the method.

Figure 9:
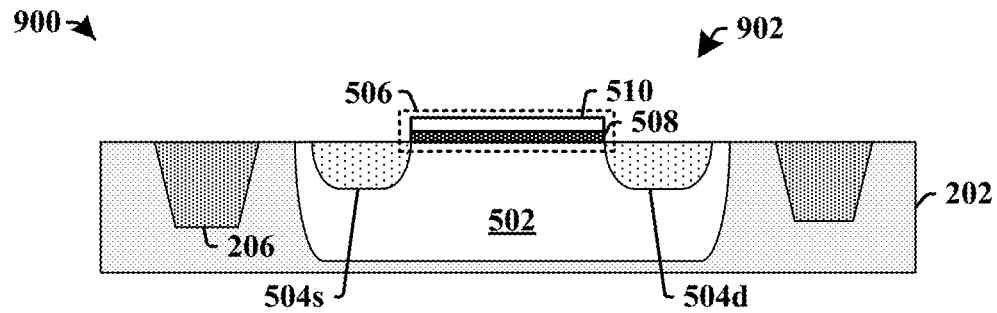
FIGS. 9-13 illustrate cross-sectional views of some embodiments of a method of forming an integrated chip comprising a memory circuit having a shared control device configured to provide access to target and complementary memory devices.

As shown in cross-sectional view 900 of FIG. 9, a control device 902 is formed within a substrate 202. In some embodiments, the control device 902 may comprise a transistor device. For example, in various embodiments, the control device 902 may comprise a MOSFET, a bi-polar junction transistor (BJT), a high electron mobility transistor (HEMT), or a similar device. In various embodiments, the substrate 202 may be any type of semiconductor body (e.g., silicon, SiGe, SOI, etc.), such as a semiconductor wafer and/or one or more die on a wafer, as well as any other type of semiconductor and/or epitaxial layers, associated therewith.

In some embodiments, the control device 902 may comprise a transistor formed by depositing a gate dielectric film and a gate electrode film over the substrate 202. The gate dielectric film and the gate electrode film are subsequently patterned to form a gate dielectric layer 508 and a gate electrode 510. The substrate may be subsequently implanted to form a source region 504s and a drain region 504d within the substrate 202 on opposing sides of the gate structure 506.

Figure 10:
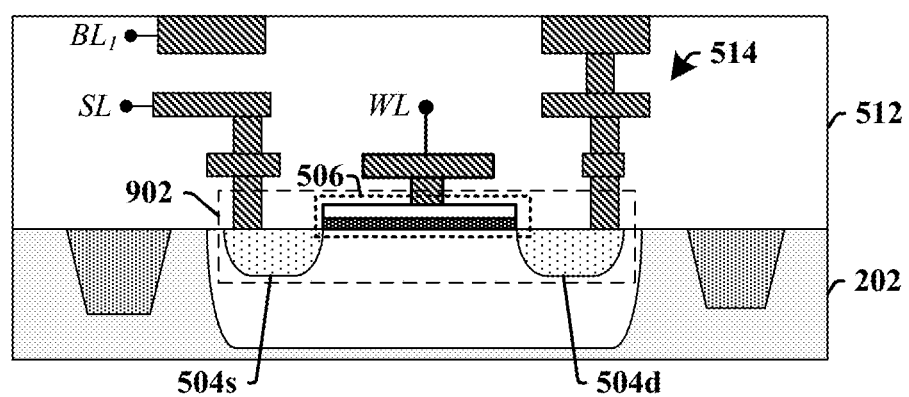

As shown in cross-sectional view 1000 of FIG. 10, a first plurality of interconnect layers 514 are formed within a first ILD structure 512 over the substrate 202. The first plurality of interconnect layers 514 couple the source region to a source-line SL and the gate structure 506 to a word-line WL. The first plurality of interconnect layers 514 may be formed by repeatedly depositing an ILD layer over the substrate, selectively etching the ILD layer (e.g., an oxide, a low-k dielectric, or an ultra low-k dielectric) to define a via hole and/or a trench within the ILD layer, forming a conductive material (e.g., copper, aluminum, etc.) within the via hole and/or a trench to fill the opening, and performing a planarization process (e.g., a chemical mechanical planarization process).

Figure 11:
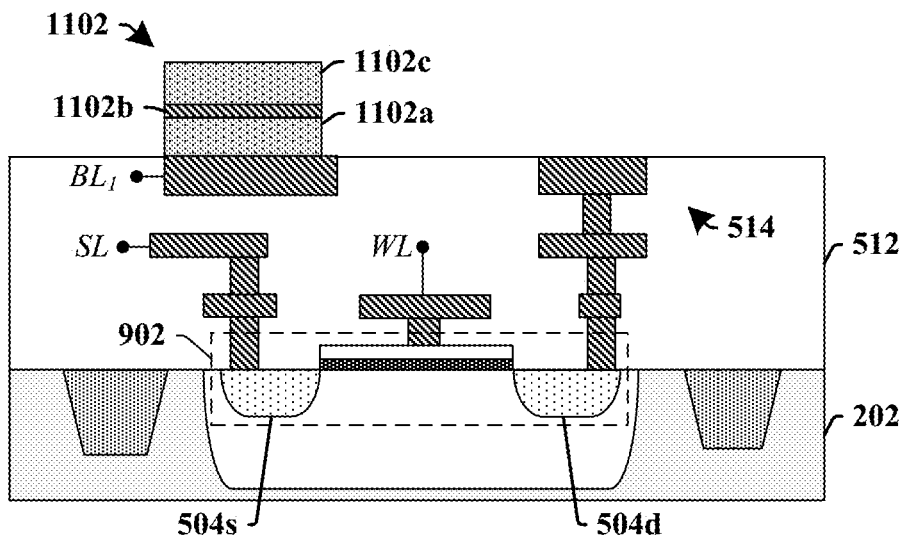

As shown in cross-sectional view 1100 of FIG. 11, a first memory device 1102 is formed over the first ILD structure 512. The first memory device 1102 comprises a first lower electrode 1102a separated from a first upper electrode 1102c by way of a first data storage layer 1102b. In various embodiments, the first memory device 1102 may comprise an RRAM device, a PCRAM device, an MRAM device, a DRAM device, a CBRAM device, or a CNT device, or the like. The first lower electrode 1102a is coupled to a first bit-line $BL_1$ within the first plurality of interconnect layers 514.

In some embodiments, the first memory device 1102 may be formed by depositing a lower electrode film over the first ILD structure 512, forming a data storage element over the lower electrode film, and forming an upper electrode film over the data storage element. In some embodiments, the lower and upper electrode films may comprise a conductive materials formed by way of a deposition technique (e.g., physical vapor deposition (PVD), chemical vapor deposition (CVD), PE-CVD, atomic layer deposition (ALD), sputtering, etc.) and the data storage element may comprise a dielectric material formed by way of a deposition technique. For example, the lower and upper electrode films may comprise a metal or metal alloy comprising titanium (Ti) and/or tantalum (Ta), while the data storage element may comprise a high-k dielectric material (e.g., hafnium oxide). One or more patterning processes are performed on the upper electrode film to define the first upper electrode 1102c, the data storage element to define the first data storage layer 1102b, and the lower electrode film to define the first lower electrode 1102a. In some embodiments, the one or more patterning processes may use a dry etchant having an etching chemistry comprising a fluorine species (e.g., $CF_4$, $CHF_3$, $C_4F_8$, etc.) or a wet etchant comprising hydroflouric acid (HF).

Figure 12:
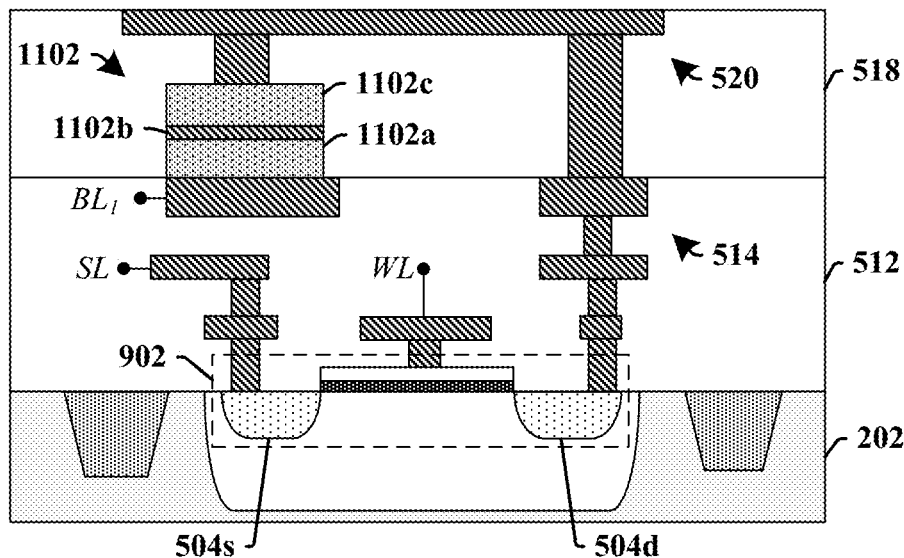

As shown in cross-sectional view 1200 of FIG. 12, a second ILD structure 518 is formed over the first memory device 1102. The second ILD structure 518 may be formed by one or more deposition processes (e.g., PVD, CVD, PE-CVD, etc.). A second plurality of interconnect layers 520 are formed within the second ILD structure 518. The second plurality of interconnect layers 520 couple the first upper electrode 1102c to the drain region 504d by way of the first plurality of interconnect layers 514. In some embodiments, the second plurality of interconnect layers 520 may be formed by selectively etching the second ILD structure 518 to form openings within the second ILD structure 518. A conductive material (e.g., copper and/or aluminum) is then deposited within the openings.

Figure 13:
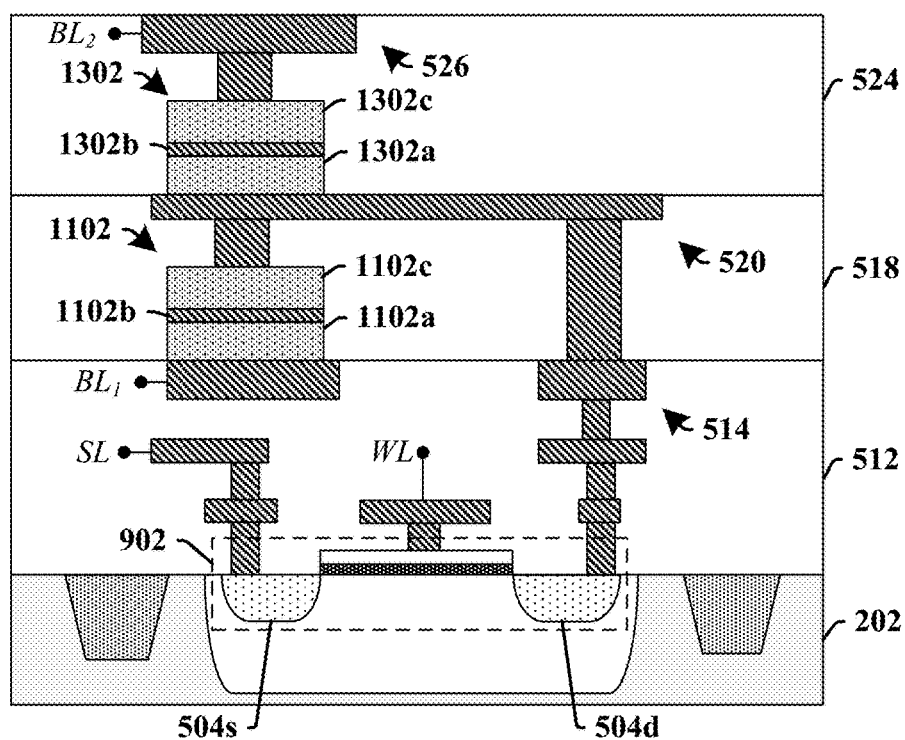

As shown in cross-sectional view 1300 of FIG. 13, a second memory device 1302 is formed over the second ILD structure 518. The second memory device 1302 comprises a second lower electrode 1302a separated from a second upper electrode 1302c by way of a second data storage layer 1302b. The second lower electrode 1302a may be coupled to the drain region 504d by way of the first plurality of interconnect layers 514 and the second plurality of interconnect layers 520. In some embodiments, the second memory device 1302 may be formed by a process similar to the process used to form the first memory device 1102.

A third ILD structure 524 is formed over the second memory device 1302, and a third plurality of interconnect layers 526 is subsequently formed within the third ILD structure 524. The second upper electrode 1302c is coupled to a second bit-line $BL_2$ within the third plurality of interconnect layers 526.

FIGS. 14-17 illustrate cross-sectional views 1400-1700 of some alternative embodiments of a method of forming an integrated chip comprising a memory circuit having a shared transistor for access to target and complementary devices. Although FIGS. 14-17 are described in relation to a method, it will be appreciated that the structures disclosed in FIGS. 14-17 are not limited to such a method, but instead may stand alone as structures independent of the method.

Figure 14:
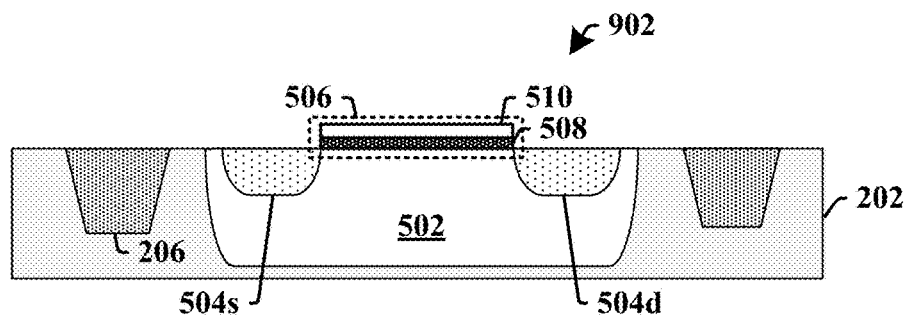
FIGS. 14-17 illustrate cross-sectional views of some alternative embodiments of a method of forming an integrated chip comprising a memory circuit having a shared control device configured to provide access to target and complementary memory devices.

As shown in cross-sectional view 1400 of FIG. 14, a control device 902 is formed within a substrate 202. In various embodiments, the control device 902 may comprise a transistor device, such as a MOSFET, a BJT, a HEMT, or a similar device.

Figure 15:
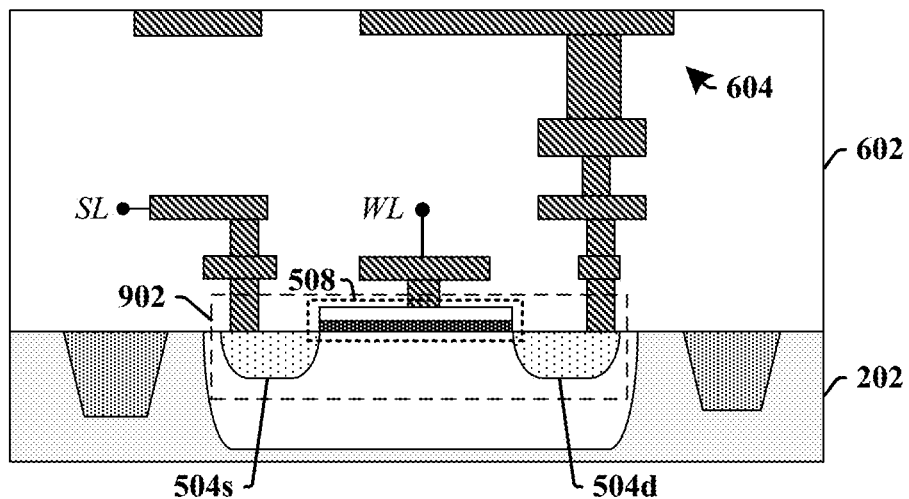

As shown in cross-sectional view 1500 of FIG. 15, a first plurality of interconnect layers 604 are formed within a first ILD structure 602 over the substrate 202. The first plurality of interconnect layers 604 are configured to couple a source region 504s of the control device 902 to a source-line SL and a drain region 504d of the control device 902 to a word-line WL.

Figure 16:
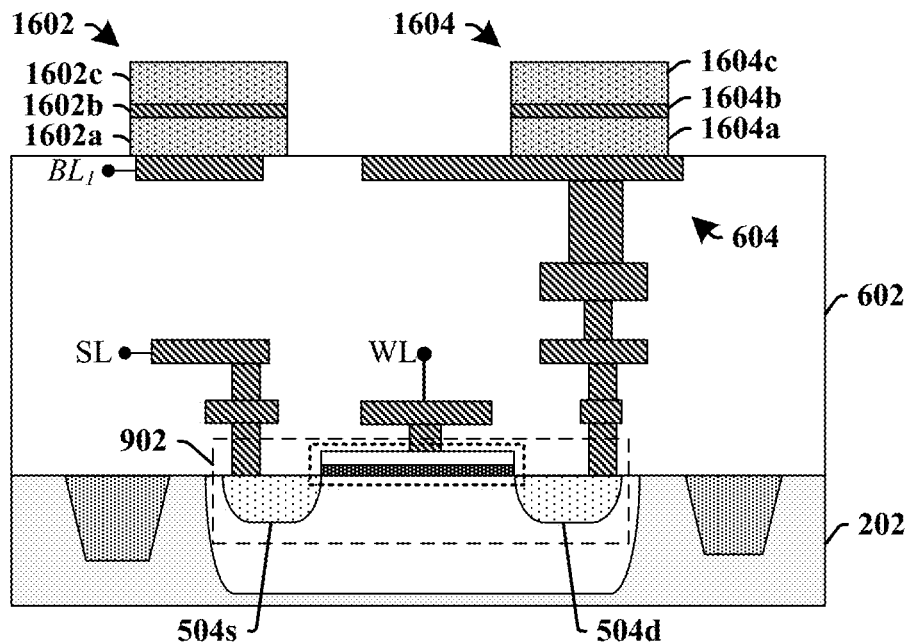

As shown in cross-sectional view 1600 of FIG. 16, a first memory device 1602 and a second memory device 1604 are formed over a first ILD structure 602. The first memory device 1602 comprises a first lower electrode 1602*a* separated from a first upper electrode 1602*c* by way of a first data storage layer 1602*b*. The second memory device 1604 comprises a second lower electrode 1604*a* separated from a second upper electrode 1604*c* by way of a second data storage layer 1604*b*. The first plurality of interconnect layers 604 are configured to couple the first lower electrode 1602*a* to a first bit-line $BL_1$ and the second lower electrode to source region of the control device 902.

Figure 17:
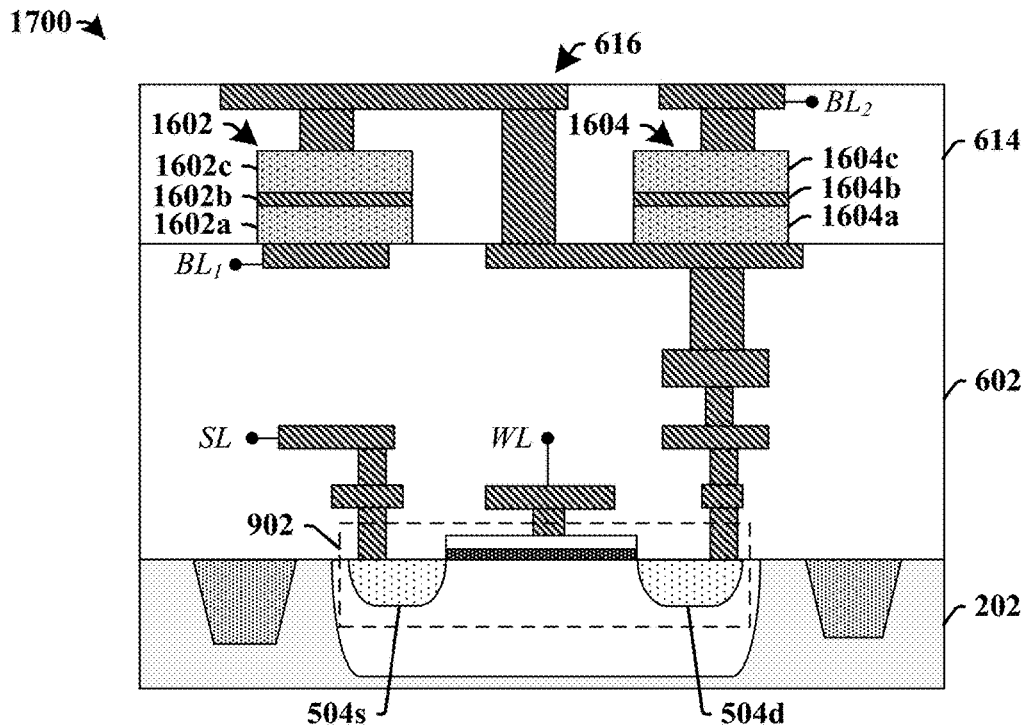

As shown in cross-sectional view 1700 of FIG. 17, a second ILD structure 614 is formed over the first memory device 1602 and the second memory device 1604. The second ILD structure 614 may be formed by a deposition process (e.g., PVD, CVD, PE-CVD, etc.) to cover the first memory device 1602 and the second memory device 1604. A second plurality of interconnect layers 616 are formed within the second ILD structure 614. The second plurality of interconnect layers 616 are configured to couple the first upper electrode 1602*c* to the source region of the control device 902 and to further couple the second upper electrode 1604*c* to a second bit-line $BL_2$.

Figure 18:
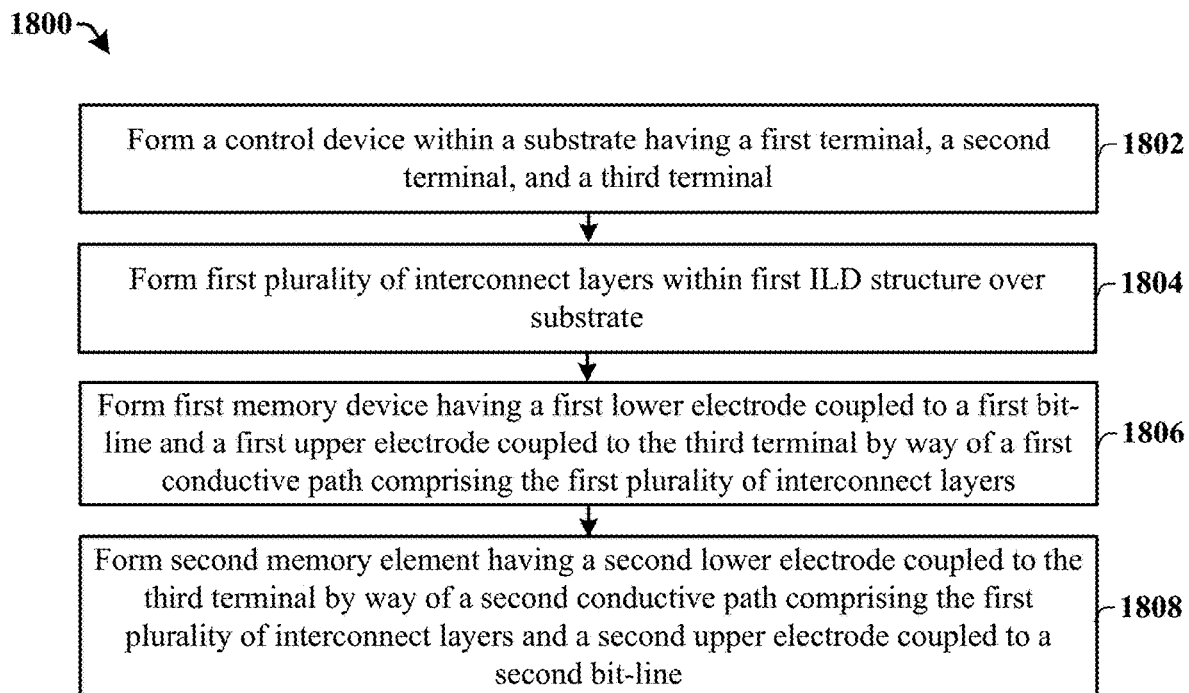
FIG. 18 illustrates a flow diagram of some embodiments of a method of forming an integrated chip comprising a memory circuit having a shared control device configured to provide access to target and complementary memory devices.

FIG. 18 illustrates a flow diagram of some embodiments of a method 1800 of forming an integrated chip comprising an RRAM device having a multi-layer data storage structure.

While method 1800 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1802, a control device is formed within a substrate. The control device comprises a first terminal, a second terminal, and a third terminal. In some embodiments, the first terminal may comprise a source region, the second terminal may comprise a gate structure, and the third terminal may comprise a drain region. FIG. 9 illustrates a cross-sectional view 900 of some embodiments corresponding to act 1802. FIG. 14 illustrates a cross-sectional view 1400 of some alternative embodiments corresponding to act 1802.

At 1804, a first plurality of interconnect layers are formed within a first ILD structure over the substrate. The first plurality of interconnect layers couple the first terminal to a source-line and the second terminal to a word-line. FIG. 10 illustrates a cross-sectional view 1000 of some embodiments corresponding to act 1804. FIG. 15 illustrates a cross-sectional view 1500 of some alternative embodiments corresponding to act 1804.

At 1806, a first memory device is formed. The first memory device has a first lower electrode coupled to a first bit-line and a first upper electrode coupled to the third terminal by way of a first conductive path comprising the first plurality of interconnect layers. FIG. 12 illustrates a cross-sectional view 1200 of some embodiments corresponding to act 1806. FIG. 16 illustrates a cross-sectional view 1600 of some embodiments corresponding to act 1806.

At 1808, a second memory element is formed. The second memory device has a second lower electrode coupled to the third terminal by way of a second conductive path comprising the first plurality of interconnect layers and a second upper electrode coupled to the second bit-line. FIG. 13 illustrate a cross-sectional view 1300 of some embodiments corresponding to act 1808. FIGS. 16-17 illustrate cross-sectional views 1600-1700 of some embodiments corresponding to act 1808.

Therefore, the present disclosure in various embodiments relates to a memory circuit having a shared control device for access to both target and complementary memory devices of a memory array configured to operate using differential sensing.

In some embodiments, the present disclosure relates to a memory circuit. The memory circuit includes a control device arranged within a substrate and having a first terminal coupled to a source-line, a second terminal coupled to a word-line, and a third terminal; a first memory device having a first lower electrode separated from a first upper electrode by a first data storage layer, the first upper electrode is coupled to the third terminal and the first lower electrode is coupled to a first bit-line; and a second memory device having a second lower electrode separated from a second upper electrode by a second data storage layer, the second upper electrode is coupled to a second bit-line and the second lower electrode is coupled to the third terminal. In some embodiments, the control device comprises a transistor device having a source region coupled to the source-line, a gate structure coupled to the word-line, and a drain region coupled to the first upper electrode and the second lower electrode. In some embodiments, the first memory device and the second memory device are resistive random access memory (RRAM) devices. In some embodiments, the circuit further includes a first inter-level dielectric (ILD) structure between the first memory device and the substrate; a second ILD structure over the first ILD structure and surrounding the first memory device; and a third ILD structure over the second ILD structure and surrounding the second memory device. In some embodiments, the circuit further includes a first plurality of interconnect layers arranged within the first ILD structure and a second plurality of interconnect layers arranged within the second ILD structure, the second plurality of interconnect layers comprise a metal wire extending between the first upper electrode and the second lower electrode and coupled to the second terminal by way of the first plurality of interconnect layers. In some embodiments, the second memory device is arranged directly above the first memory device. In some embodiments, the second ILD structure is separated from the third ILD structure by an etch stop layer. In some embodiments, the first memory device has a bottommost surface that is closer to the substrate than a bottommost surface of the second memory device. In some embodiments, a horizontal plane extending parallel to an upper surface of the substrate extends through the first memory device and the second memory device. In some embodiments, the first bit-line is selectively configured to be coupled to a first input of a sense amplifier concurrent to the second bit-line being coupled to a second input of the sense amplifier. In some embodiments, the first memory device is configured to concurrently store a data state that is different than the second memory device.

In other embodiments, the present disclosure relates to a memory circuit. The memory circuit includes a control device arranged within a substrate; a first memory device arranged within a dielectric structure over the substrate and having a first lower electrode separated from a first upper electrode by a first data storage layer; a plurality of interconnect layers surrounded by the dielectric structure and configured to couple the first upper electrode to the control device and the first lower electrode to a first bit-line; and a second memory device arranged within the dielectric structure and having a second lower electrode separated from a second upper electrode by a second data storage layer, the plurality of interconnect layers are configured to couple the second upper electrode to a second bit-line and the second lower electrode to the control device. In some embodiments, the plurality of interconnect layers comprise a conductive path that continuously extends between the first upper electrode and the second lower electrode. In some embodiments, the conductive path comprises a conductive wire and a conductive via. In some embodiments, the control device has a first terminal coupled to a source-line, a second terminal coupled to a word-line, and a third terminal coupled to the first upper electrode and the second lower electrode. In some embodiments, the circuit further includes a first inter-level dielectric (ILD) structure over the substrate; a second ILD structure over the first ILD structure and surrounding the first memory device; and a third ILD structure over the second ILD structure and surrounding the second memory device. In some embodiments, the control device is arranged within a memory cell region surrounded by one or more isolation regions within the substrate; and the first memory device and the second memory device are arranged directly over the memory cell region.

In yet other embodiments, the present disclosure relates to a method of forming a memory circuit. The method includes forming a control device within a substrate; forming a first memory device having a first lower electrode coupled to a first bit-line and a first upper electrode coupled to the control device; and forming a second memory device having a second lower electrode coupled to the control device and a second upper electrode coupled to a second bit-line. In some embodiments, the first memory device has a bottommost surface that is closer to the substrate than a bottommost surface of the second memory device. In some embodiments, a horizontal plane extending parallel to an upper surface of the substrate extends through the first memory device and the second memory device.

In yet other embodiments, the present disclosure relates to a method of forming a memory circuit. The method includes forming a control device within a substrate; forming a first ILD structure over the substrate, the first ILD structure comprises a first plurality of interconnect layers; forming a first memory device over the first ILD structure, the first memory device has a first lower electrode coupled to a first bit-line and a first upper electrode coupled to the control device by way of a first conductive path comprising the first plurality of interconnect layers; and forming a second memory device over the first ILD structure, the second memory device has a second lower electrode coupled to the control device by way of a second conductive path comprising the first plurality of interconnect layers and a second upper electrode coupled to a second bit-line. In some embodiments, the method further includes forming a second ILD structure surrounding the first memory device and a second plurality of interconnect layers, the second plurality of interconnect layers couple the first upper electrode to the control device by way of the first plurality of interconnect layers. In some embodiments, the second plurality of interconnect layers comprise a metal wire extending between the first memory device and the second memory device. In some embodiments, the second ILD structure further surrounds the second memory device and couples the second upper electrode coupled to the second bit-line. In some embodiments, the method further includes forming a third ILD structure surrounding a third plurality of interconnect layers over the second memory device, the third plurality of interconnect layers couple the second upper electrode to the second bit-line. In some embodiments, the method further includes forming the first memory device concurrent to the second memory device, the first memory device and the second memory device are laterally adjacent to one another. In some embodiments, the method further includes forming the first memory device before forming the second memory device, the first memory device has a bottommost surface that is closer to the substrate than a bottommost surface of the second memory device.

In yet other embodiments, the present disclosure relates to a method of forming a memory circuit. The method includes forming an access transistor within a substrate, the access transistor has a source region, a drain region, and a gate structure; forming a first ILD structure over the substrate; forming a first memory device over the first ILD structure, the first memory device has a first lower electrode separated from a first upper electrode by a first data storage layer; forming a second memory device over the first ILD structure, the second memory device has a second lower electrode separated from a second upper electrode by a second data storage layer; and the first upper electrode and the second lower electrode are coupled to the drain region. In some embodiments, the method further includes forming a first plurality of interconnect layers within the first ILD structure; and forming a second plurality of interconnect layers within a second ILD structure over the first ILD structure, the first plurality of interconnect layers and the second plurality of interconnect layers couple the first upper electrode to the drain region. In some embodiments, the second ILD structure surrounds the first memory device. In some embodiments, the second lower electrode is coupled to the drain region by way of a conductive path comprising the first plurality of interconnect layers. In some embodiments, the method further includes forming a third ILD structure surrounding the second memory device, the first plurality of interconnect layers and the second plurality of interconnect layers couple the second lower electrode to the drain region. In some embodiments, the method further includes forming the first memory device concurrent to the second memory device. In some embodiments, the method further includes forming the first memory device before forming the second memory device.

In yet other embodiments, the present disclosure relates to a memory circuit. The memory circuit include an access transistor arranged within a substrate and having a first terminal coupled to a source-line, a second terminal coupled to a word-line, and a third terminal; a first memory device having a first lower electrode separated from a first upper electrode by a first data storage layer, the first lower electrode is configured to be selectively coupled to a first input terminal of a sense amplifier and the first upper electrode is coupled to the third terminal; and a second memory device having a second lower electrode separated from a second upper electrode by a second data storage layer, the second lower electrode is coupled to the third terminal and the second upper electrode is configured to be selectively coupled to a second input terminal of the sense amplifier concurrent to the first lower electrode being coupled to the first input terminal of the sense amplifier. In some embodiments, the first memory device and the second memory device are RRAM (resistive random access memory) devices, PCRAM (phase change random access memory) devices, FRAM (ferroelectric random access memory) devices, MRAM (magneto-resistive random access memory) devices, CBRAM (conductive bridging random access memory) devices, or carbon nano-tube (CNT) memory devices. In some embodiments, the first memory device and the second memory device are arranged within a dielectric structure over the substrate. In some embodiments, the access transistor comprises a source region corresponding to the first terminal, a gate structure corresponding to the second terminal, and a drain region corresponding to the third terminal. In some embodiments, the second memory device is vertically separated from the first memory device by an interconnect wire extending parallel to an upper surface of the substrate. In some embodiments, the second memory device and the first memory device vertically overlie the access transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. For example, although the disclosure describes the oxygen barrier layer as being within a multi-layer upper electrode, it will be appreciated that the oxygen barrier layer is not limited to the upper electrode. Rather, the oxygen barrier layer may also or alternatively be present in a multi-layer lower electrode.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a memory circuit, comprising:
forming a control device within a substrate;
forming a first memory device having a first lower electrode and a first upper electrode, the first upper electrode coupled between the first lower electrode and the control device;
forming a second memory device having a second lower electrode and a second upper electrode, the second lower electrode coupled between the second upper electrode and the control device; and
wherein the first memory device and the second memory device are concurrently formed.

2. The method of claim 1, wherein a horizontal plane that is parallel to an upper surface of the substrate extends through sidewalls of the first memory device and the second memory device at positions above bottoms of the first memory device and the second memory device.

3. The method of claim 1,
wherein the first lower electrode is operably coupled to a first bit-line; and
wherein the second lower electrode is operably coupled to a second bit-line.

4. The method of claim 1, wherein the first memory device is vertically over the substrate and is coupled to the second memory device by way of an interconnect that is directly laterally between the first memory device and the second memory device.

5. The method of claim 3, further comprising:
operably coupling the first lower electrode between the first upper electrode and a first input of a sense amplifier; and
operably coupling the second upper electrode between the second lower electrode and a second input of the sense amplifier.

6. A method of forming an integrated chip, comprising:
forming a control device within a substrate;
forming a first plurality of interconnect layers within a first inter-level dielectric (ILD) structure over the substrate;
forming a first memory device over the first ILD structure;
forming a second memory device over the first ILD structure;
forming a second plurality of interconnect layers within a second ILD structure over the first ILD structure; and
wherein the first plurality of interconnect layers and the second plurality of interconnect layers directly couple the control device to a plurality of locations, the plurality of locations consisting of the first memory device and the second memory device.

7. The method of claim 6, further comprising:
forming the first memory device before forming the second memory device, wherein the first memory device has a bottommost surface that is closer to the substrate than a bottommost surface of the second memory device.

8. The method of claim 6, further comprising:
forming the first memory device concurrent to forming the second memory device, wherein the first memory device and the second memory device are laterally adjacent to one another.

9. The method of claim 6, wherein the second plurality of interconnect layers comprise a metal wire directly between the first memory device and the second memory device.

10. The method of claim 6, wherein the second ILD structure is formed to laterally surround the first memory device and the second memory device.

11. The method of claim 6, further comprising:
wherein the first memory device has a first lower electrode over the first ILD structure and a first upper electrode over the first lower electrode; and
wherein the first plurality of interconnect layers and the second plurality of interconnect layers are coupled between the first upper electrode and control device.

12. The method of claim 11, wherein the second memory device has a second lower electrode over the first ILD structure and a second upper electrode over the second lower electrode.

13. The method of claim 12, further comprising:
forming a third plurality of interconnect layers within a third ILD structure formed over the second ILD structure and laterally surrounding the second memory device;
wherein the first plurality of interconnect layers define a first bit-line coupled to the first lower electrode; and
wherein the third plurality of interconnect layers define a second bit-line coupled to the second upper electrode.

14. A method of forming an integrated chip, comprising:
forming an access transistor within a substrate, wherein the access transistor has a source region, a drain region, and a gate structure;
forming a first memory device over the substrate, wherein the first memory device has a first lower electrode separated from a first upper electrode by a first data storage layer and by a first capping layer arranged between a top of the first data storage layer and a bottom of first upper electrode;

forming a second memory device over the substrate, wherein the second memory device has a second lower electrode separated from a second upper electrode by a second data storage layer and by a second capping layer arranged between a top of the second data storage layer and a bottom of the second upper electrode; and forming a plurality of interconnect layers over the substrate, wherein the plurality of interconnect layers are configured to couple both the first upper electrode and the second lower electrode to the drain region.

15. The method of claim 14,
wherein the plurality of interconnect layers comprise an interconnect wire that is formed over the first memory device; and
wherein the second memory device is formed over the interconnect wire.

16. The method of claim 14, wherein the plurality of interconnect layers electrically terminate at the first memory device and at the second memory device.

17. The method of claim 14, further comprising:
forming the first memory device concurrent to forming the second memory device.

18. The method of claim 14, further comprising:
forming the first memory device before forming the second memory device.

19. The method of claim 14, further comprising:
forming a first plurality of interconnect layers within a first inter-level dielectric (ILD) structure formed over the substrate; and
forming a second plurality of interconnect layers within a second ILD structure formed over the first ILD structure, wherein the second ILD structure laterally surrounds the first memory device.

20. The method of claim 19, wherein the second lower electrode is coupled to the drain region by way of a conductive path comprising the first plurality of interconnect layers.

* * * * *